US009929165B1

United States Patent
Luo et al.

(10) Patent No.: US 9,929,165 B1
(45) Date of Patent: Mar. 27, 2018

(54) METHOD FOR PRODUCING INTEGRATED CIRCUIT MEMORY CELLS WITH LESS DEDICATED LITHOGRAPHIC STEPS

(71) Applicant: Globalfoundries Singapore Pte. Ltd., Singapore (SG)

(72) Inventors: Laiqiang Luo, Singapore (SG); Yu Jin Eugene Kong, Singapore (SG); Daxiang Wang, Singapore (SG); Fan Zhang, Singapore (SG); Danny Pak-Chum Shum, Singapore (SG); Pinghui Li, Singapore (SG); Zhiqiang Teo, Singapore (SG); Juan Boon Tan, Singapore (SG); Soh Yun Siah, Singapore (SG); Pey Kin Leong, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/278,112

(22) Filed: Sep. 28, 2016

(51) Int. Cl.
*H01L 27/07* (2006.01)
*H01L 27/11521* (2017.01)
(Continued)

(52) U.S. Cl.
CPC .... *H01L 27/11521* (2013.01); *H01L 21/0273* (2013.01); *H01L 21/26513* (2013.01);
(Continued)

(58) Field of Classification Search
CPC ......... H01L 27/11521; H01L 27/11517; H01L 21/0274; H01L 21/2652; H01L 21/26513; H01L 21/31; H01L 21/308; H01L 21/76805; H01L 21/76802; H01L 29/66825

See application file for complete search history.

(56) References Cited

U.S. PATENT DOCUMENTS 5,075,250 A * 12/1991 Hawkins ............ B41J 2/1604
  148/DIG. 136
6,197,639 B1 * 3/2001 Lee .................. H01L 21/76802
  257/E21.507

(Continued)

OTHER PUBLICATIONS

Intellectual Property Office, Examination and Search Report for Taiwanese Patent Application No. 105133539, dated Dec. 11, 2017, 4 pages.

*Primary Examiner* — Andrew Q Tran
(74) *Attorney, Agent, or Firm* — Lorenz & Kopf, LLP

(57) ABSTRACT

Methods of producing integrated circuits are provided. An exemplary method includes patterning a source line photoresist mask to overlie a source line area of a substrate while exposing a drain line area. The source line area is between a first and second memory cell and the drain line area is between the second and a third memory cell. A source line is formed in the source line area. A source line dielectric is concurrently formed overlying the source line while a drain line dielectric is formed overlying a drain line area. A drain line photoresist mask is patterned to overlie the source line in an active section while exposing the source line in a strap section, and while exposing the drain line area. The drain line dielectric is removed from over the drain line area while a thickness of the source line dielectric in the strap section is reduced.

20 Claims, 7 Drawing Sheets

(51) Int. Cl.
*H01L 21/027* (2006.01)
*H01L 29/66* (2006.01)
*H01L 29/06* (2006.01)
*H01L 21/768* (2006.01)
*H01L 21/308* (2006.01)
*H01L 21/3205* (2006.01)
*H01L 21/265* (2006.01)

(52) U.S. Cl.
CPC .... *H01L 21/3081* (2013.01); *H01L 21/32053* (2013.01); *H01L 21/76802* (2013.01); *H01L 21/76834* (2013.01); *H01L 21/76877* (2013.01); *H01L 29/0649* (2013.01); *H01L 29/66825* (2013.01)

(56) References Cited

U.S. PATENT DOCUMENTS

| | | | |
|---|---|---|---|
| 6,211,012 B1 | 4/2001 | Lee et al. | |
| 6,566,706 B1 * | 5/2003 | Wang | H01L 27/115 257/239 |
| 7,732,317 B2 * | 6/2010 | Shin | H01L 21/76831 257/E21.577 |
| 2016/0056278 A1 | 2/2016 | Avci et al. | |
| 2016/0225777 A1 | 8/2016 | Cheng | |

* cited by examiner

METHOD FOR PRODUCING INTEGRATED CIRCUIT MEMORY CELLS WITH LESS DEDICATED LITHOGRAPHIC STEPS

TECHNICAL FIELD

The technical field generally relates to methods of producing integrated circuits having memory cells, and more particularly relates to low cost methods of producing integrated circuits having memory cells.

BACKGROUND

Embedded super flash memory cells are used in certain integrated circuits, where the embedded super flash memory cells can be erased and re-programmed. There are at least three generations of super flash memory cells, where each generation is smaller than the previous. The third generation memory cells include a stack with a control gate overlaying a control gate dielectric that in turn overlies a floating gate, where the floating gate overlies a floating gate dielectric. The entire stack overlies a substrate.

Many processes are included in the production of such integrated circuits, such as lithography, etching and deposition. Lithography involves the deposition of a photoresist layer followed by patterning of that photoresist layer. The photoresist layer can be patterned by exposure to light or other electromagnetic radiation through a mask with transparent sections and opaque sections. The light causes a chemical change in the photoresist such that either the exposed portion or the non-exposed portion can be selectively removed. Lithography techniques are expensive, so integrated circuit production techniques that include more lithography processes tend to be more expensive than those with fewer lithography processes.

Accordingly, it is desirable to provide methods of producing integrated circuits with fewer lithography processes than traditional production methods. In addition, it is desirable to provide methods of producing integrated circuits with embedded super flash memory cells while reducing the number of lithography processes compared to traditional production processes. Furthermore, other desirable features and characteristics of the present embodiment will become apparent from the subsequent detailed description and the appended claims, taken in conjunction with the accompanying drawings and this background of the invention.

BRIEF SUMMARY

Methods of producing integrated circuits are provided. An exemplary method includes patterning a source line photoresist mask to overlie a source line area of a substrate while exposing a drain line area. The source line area is between a first and second memory cell and the drain line area is between the second and a third memory cell. A source line is formed in the source line area. A source line dielectric is concurrently formed overlying the source line while a drain line dielectric is formed overlying a drain line area. A drain line photoresist mask is patterned to overlie the source line in an active section while exposing the source line in a strap section, and while exposing the drain line area. The drain line dielectric is removed from over the drain line area while a thickness of the source line dielectric in the strap section is reduced.

A method of producing integrated circuits is provided in another embodiment. The method includes patterning a source line photoresist mask to overlie a drain line area and to overlie a source line area within a strap section of the integrated circuit while exposing the source line area within an active section of the integrated circuit. The source line area is between a first memory cell and a second memory cell, and the drain line area is between the second memory cell and a third memory cell. A source line is formed in the source line area of the active section. A source line dielectric is concurrently formed with a drain line dielectric, where the source line dielectric overlies the source line area in both the active section and the strap section and the drain line dielectric overlies the drain line area in both the active and strap sections. An interlayer dielectric is formed overlying the source line area and the drain line area, and a via is formed through the interlayer dielectric to the source line area in the strap section. The source line dielectric is removed from overlying the source line area within the via, and a contact is formed in electrical communication with the source line area in the strap section.

A method of producing an integrated circuit is provided in yet another embodiment. The method includes patterning a source line photoresist mask to overlie a drain line area while exposing a source line area within an active section of the integrated circuit, where the source line photoresist mask overlies the source line area in a strap section. The source line area is defined within a substrate between first and second memory cells, and the drain line area is defined within the substrate between second and third memory cells. A source line is formed in the source line area within the active section of the integrated circuit. A source line dielectric is concurrently formed with a drain line dielectric, where the source line dielectric overlies the source line area and the drain line dielectric overlies the drain line area. A drain line photoresist mask is patterned to overlie the source line in the active section while exposing the source line area in the strap section, and where the drain line photoresist mask exposes the drain line area in both the active and strap sections of the integrated circuit. The drain line dielectric is removed from over the drain line area while a thickness of the source line dielectric in the strap section is reduced. An interlayer dielectric is formed overlying the source line area and the drain line area, and a contact is formed in electrical communication with the source line area in the strap section.

BRIEF DESCRIPTION OF THE DRAWINGS

The present embodiments will hereinafter be described in conjunction with the following drawing figures, wherein like numerals denote like elements, and wherein:

FIGS. 1, 3, and 5-7 are cross sectional views illustrating a strap section of the integrated circuit and FIGS. 2 and 4 are perspective sectional views; FIGS. 8 and 10-14 are cross sectional views illustrating a strap section of the integrated circuit and FIG. 9 is a perspective sectional view.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to methods for fabricating integrated circuits. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Figure 1:
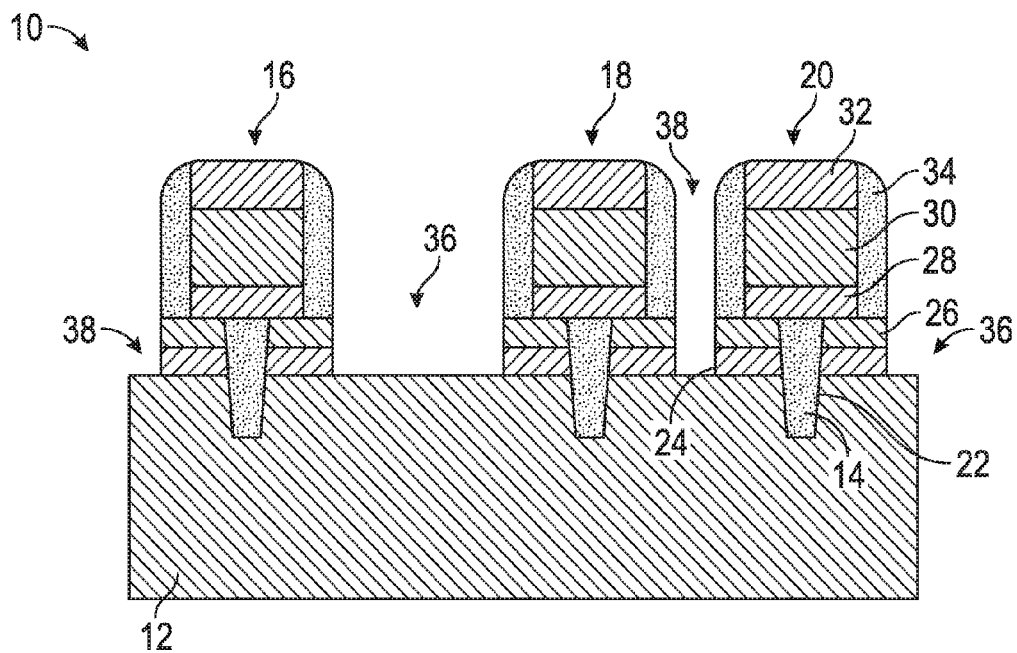
FIGS. 1-7 illustrate an integrated circuit and embodiments for its fabrication, where

A method of producing an integrated circuit with flash memory cells is provided, where the flash memory cells may be third generation super flash memory cells. The integrated circuit is produced with fewer lithography processes than used in the traditional production method, where process variations described herein allow for reliable production processes where at least one lithography step is removed, as described below. Referring to an exemplary embodiment illustrated in FIG. 1, an integrated circuit 10 includes a substrate 12 that includes semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least 10 weight percent or more based on the total weight of the material unless otherwise indicated. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

A plurality of shallow trench isolation structures 14 may be positioned within the substrate 12, where the shallow trench isolation structures 14 are electrical insulators. As used herein, an "electrically insulating material" or an "electrical insulator" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from more than about $1 \times 10^{-4}$ ohm meters to less than about $1 \times 10^4$ ohm meters. In an exemplary embodiment the shallow trench isolation structures 14 includes silicon dioxide, but other electrically insulating materials may be present in alternate embodiments.

A plurality of memory cells overlie the substrate 12 and the shallow trench isolation structures 14, including a first memory cell 16, a second memory cell 18, and a third memory cell 20. As used herein, the term "overlying" means "over" such that an intervening layer may lie between the shallow trench isolation structures 14 and the memory cells 16, 18, 20 or "on" such that the shallow trench isolation structures 14 physically contacts the memory cells 16, 18, 20. Moreover, the term "directly overlying" means a vertical line passing through the upper component also passes through the lower component, such that at least a portion of the upper component is directly over at least a portion of the lower component. It is understood that the integrated circuit 10 may be moved such that the relative "up" and "down" positions change, so reference to a "vertical" line means a line that is about perpendicular to the surface of the substrate 12. Each of the memory cells 16, 18, 20 includes a floating gate dielectric 24 that is an electrical insulator, where the floating gate dielectric 24 overlies the substrate 12 and is laterally adjacent to a shallow trench isolation side surface 22. In an exemplary embodiment, the floating gate dielectric 24 is silicon dioxide, but other materials may be used in alternate embodiments. As such, the floating gate dielectric 24 for each memory cell 16, 18, 20 is positioned on opposite sides of the shallow trench isolation structure 14. Each memory cell 16, 18, 20 also includes a floating gate 26 that directly overlies the floating gate dielectric 24, where the floating gate 26 is positioned on opposite sides of the shallow trench isolation structure 14 similar to the floating gate dielectric 24. Therefore, the floating gate 26 is adjacent to the shallow trench isolation side surface 22. The floating gate 26 is an electrically conductive material, and may include polysilicon doped with conductivity determining impurities in an exemplary embodiment.

Figure 2:
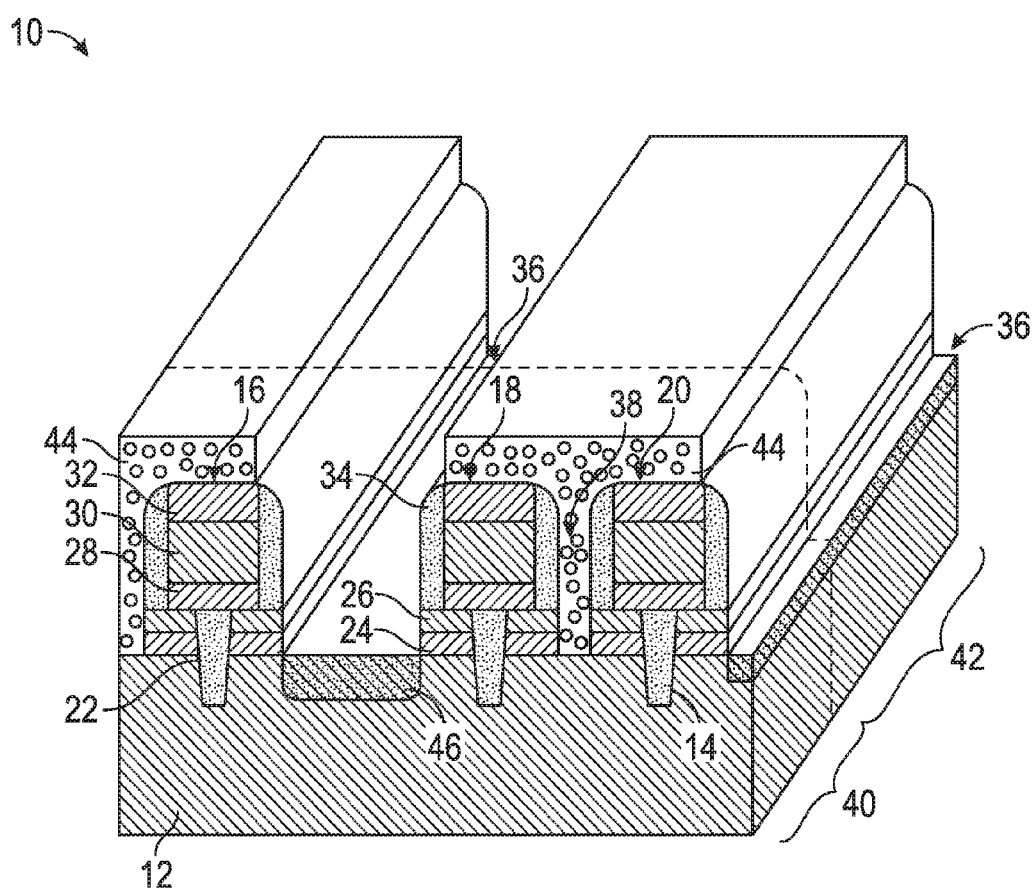

A control gate dielectric 28 directly and centrally overlies the floating gate 26 and the shallow trench isolation structures 14 in each memory cell 16, 18, 20, where the control gate dielectric 28 is an electrical insulator. In an exemplary embodiment, the control gate dielectric 28 includes a silicon dioxide/silicon nitride/silicon dioxide triple layer (not individually illustrated), but other embodiments are also possible. A control gate 30 directly and centrally overlies the control gate dielectric 28, where the control gate 30 is an electrical conductor such as polysilicon with conductivity determining impurities. A hard mask 32 directly overlies the control gate 30, where the hard mask 32 is an electrical insulator, and includes silicone dioxide in an exemplary embodiment. Spacers 34 may overlie the floating gate 26 and be laterally adjacent to opposite sides of the (i) control gate dielectric 28, (ii) the control gate 30, and (iii) the hard mask 32, where the spacers 34 are electrical insulators. In an exemplary embodiment the spacers 34 include a plurality of layers of different dielectric materials, and the number of layers and the exact composition of the spacers 34 on opposite sides of any one memory cell 16, 18, 20 may not be exactly the same. A source line area 36 of the substrate 12 is defined between the first and second memory cells 16, 18, and a drain line area 38 of the substrate 12 is defined between the second and third memory cells 18, 20. Referring momentarily to FIG. 2, a source line 46 is formed within at least a portion of the source line area 36, and a drain line (not illustrated in FIG. 1 or 2) is formed within at least a portion of the drain line area 38.

Reference is made to an exemplary embodiment in FIG. 2, where FIG. 2 is a sectional perspective view of the integrated circuit 10. The upper portion of the plurality of memory cells 16, 18, 20 each directly overlie a shallow trench isolation structure 14 in a strap section 40 of the integrated circuit 10, but the plurality of memory cells 16, 18, 20 do not directly overlie a shallow trench isolation structure 14 in an active section 42 of the integrated circuit 10 (the substrate 12 directly underlying the memory cells 16, 18, 20 in the active section 42 is not illustrated). The upper portion of the plurality of memory cells 16, 18, 20 that directly overlie the shallow trench isolation structure 14 includes the control gate dielectric 28, the control gate 30, and the hard mask 32. The strap section 40 is used for electrical connection to components formed in the substrate 12 between different memory cells 16, 18, 20, as described below, and the active section 42 is used for storing charges for memory purposes. The strap section 40 can be differentiated from the active section 42 because the strap section 40 includes a shallow trench isolation structure 14 underlying the upper portion of the plurality of memory cells 16, 18, 20, and the active section 42 does not include a shallow trench isolation structure 14 underlying the plurality of memory cells 16, 18, 20.

A source line photoresist mask 44 is formed and patterned to expose the source line area 36 while covering the drain line area 38. The source line photoresist mask 44 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed, as mentioned above. The desired locations may be removed with an organic solvent, and the source line photoresist mask 44 remains overlying the other areas of the integrated circuit 10. The source line photoresist mask 44 (and other photoresist layers described below) may optionally include a top and/or bottom anti-reflective coating and/or a hard mask (not illustrated).

A source line 46 is formed within the substrate 12 in the source line area 36 by implanting conductivity determining impurities into the exposed portion of the substrate 12. The conductivity determining impurities (i.e., "dopants") may be implanted as ions in an exemplary embodiment. Ion implantation involves ionizing the desired conductivity determining impurity and propelling the dopant ion into the substrate 12 under the influence of an electrical field. The source line photoresist mask 44 protects the drain line area 38, so the drain line area 38 is protected from implantation with conductivity determining ions at this point. In the embodiment illustrated in FIG. 2, the source line 46 is formed in the active section 42 and in the strap section 40 of the integrated circuit 10. The source line photoresist mask 44 is removed after the source line 46 is formed, such as with an oxygen containing plasma or with an appropriate solvent.

Figure 3:
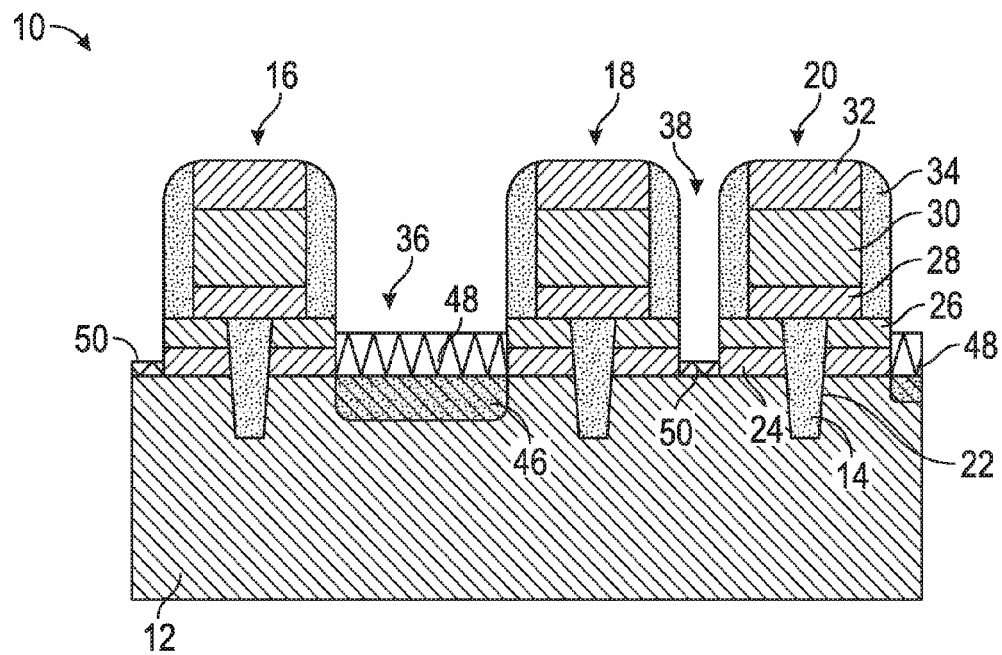

In an exemplary embodiment and as shown in FIG. 3, a source line dielectric 48 is formed overlying the source line 46, which is between the first and second memory cells 16, 18. A drain line dielectric 50 is concurrently formed with the source line dielectric 48, where the drain line dielectric 50 is formed overlying the drain line area 38. The source line dielectric 48 and the drain line dielectric 50 are electrical insulators, and may be formed by thermal oxidation in some embodiments. In some embodiments, the source line dielectric 48 and the drain line dielectric 50 include silicon dioxide, and the source line dielectric 48 may be thicker than the drain line dielectric 50. For example, in the illustrated embodiment the source line 46 has a higher concentration of conductivity determining impurities (i.e., dopants) than the drain line area 38, and thermal oxide grows more rapidly when higher concentrations of conductivity determining impurities are present. The higher concentration of conductivity determining impurities in the source line 46 compared to the drain line area 38 results in the source line dielectric 48 being thicker than the drain line dielectric 50. In an exemplary embodiment, the source line dielectric 48 is from about 400 to about 450 angstroms thick, and the drain line dielectric 50 is from about 150 to about 300 angstroms thick.

Figure 4:
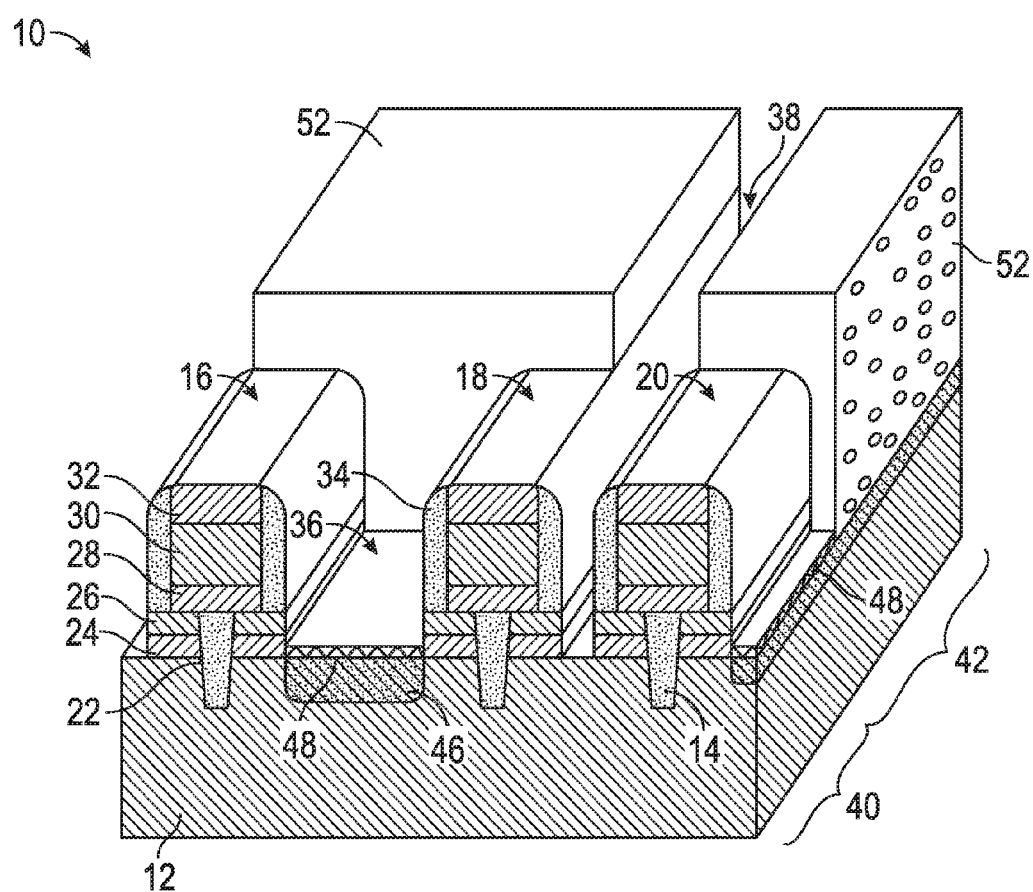

Referring to an exemplary embodiment illustrated in FIG. 4, with continuing reference to FIG. 3, a drain line photoresist mask 52 is formed and patterned overlying the substrate 12. The drain line photoresist mask 52 is patterned to overlie and cover the source line 46 in the active section 42 while exposing the drain line dielectric 50 in the drain line area 38, so the drain line dielectric 50 is exposed in both the strap and active sections 40, 42. The drain line photoresist mask 52 is also patterned to expose the source line dielectric 48 in the strap section 40. The drain line dielectric 50 is removed from overlying the drain line area 38 in the active and strap sections 42, 40, and the thickness of the source line dielectric 48 in the strap section 40 is reduced at the same time. The drain line dielectric 50 may be removed with wet etch using dilute hydrofluoric acid, but reactive ion etches or other etch techniques may be used in alternate embodiments. The removal process for the drain line dielectric 50 is performed to remove the drain line dielectric 50, so the removal process may be terminated once the drain line dielectric 50 is gone, e.g. the removal process is ceased immediately upon substantially complete removal of the drain line dielectric 50 (as determined through conventional techniques.) As such, the thicker source line dielectric 48 (as compared to the drain line dielectric 50) may not be completely removed when the drain line dielectric 50 is gone. In an exemplary embodiment, the source line dielectric 48 is reduced to a thickness of from about 150 to about 250 angstroms when the drain line dielectric 50 is removed, but other thicknesses are also possible. In some embodiments the source line dielectric 48 may be completely removed.

The use of a lithographic technique dedicated to isolating and selectively exposing the source line dielectric 48 may not be needed, because subsequent processes may remove the source line dielectric 48 in the strap section 40 to facilitate an electrical connection, as described more fully below. Reference to a lithographic technique being "dedicated" means the specific lithographic technique is not used for another purpose other than the named purpose, such as selectively exposing the source line dielectric 48 in the strap section 40. The elimination of a separate, dedicated lithographic technique to isolate and selectively expose the source line dielectric 48 reduces the cost of production because the cost for the separate, dedicated lithographic process is eliminated.

Subsequent processes may further thin and/or remove the source line dielectric 48 in the strap section 40. For example, the drain line photoresist mask 52 is removed after use, as described above for photoresist materials. In an exemplary embodiment, the drain line photoresist mask 52 is removed with a solvent wash, and hot ammonia and water are added to the solvent wash to further thin the source line dielectric 48. The addition of hot ammonia and water to the solvent wash may further thin the source line dielectric 48, such as to a thickness of from about 50 to about 200 angstroms, but the hot ammonia and water may completely remove the exposed portions of the source line dielectric 48 in the strap section 40 in some embodiments. A variety of additional washing techniques and/or etch techniques may further reduce or eliminate the source line dielectric 48, where these additional techniques may be employed for other purposes in the manufacturing process of the integrated circuit 10.

Figure 5:
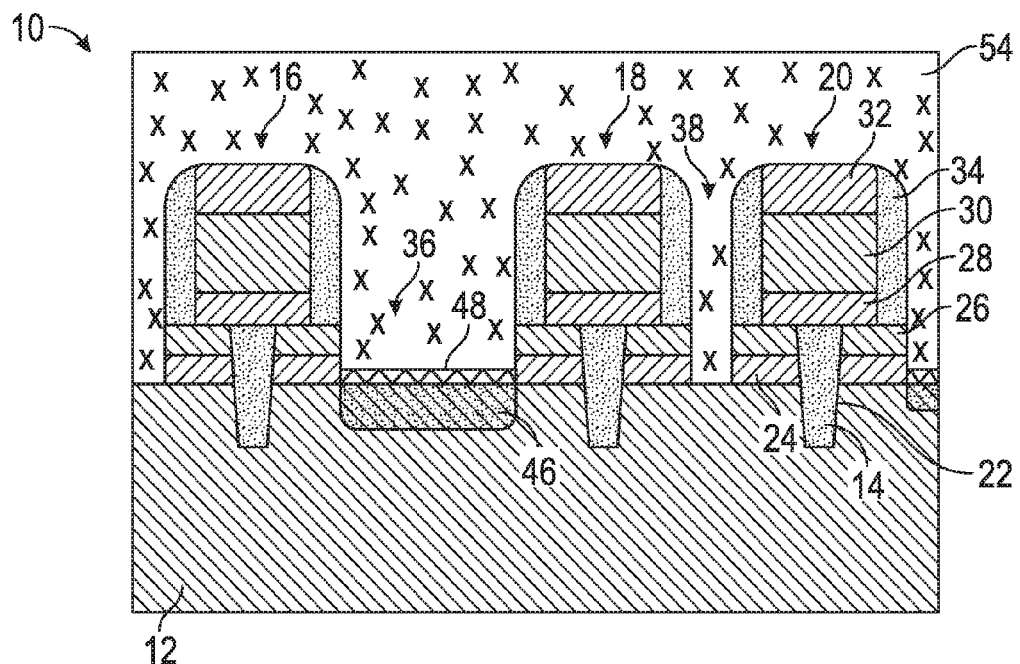

Reference is made to an exemplary embodiment in FIG. 5. An interlayer dielectric 54 is formed overlying the plurality of memory cells 16, 18, 20 and the substrate 12 therebetween, where the interlayer dielectric 54 is an electrical insulator. The interlayer dielectric 54 may include silicon dioxide, which can be formed by chemical vapor deposition using silane and oxygen, but other electrically insulating materials may be used in alternate embodiments. A thin layer of the source line dielectric 48 remains overlying the source line 46 in the embodiment illustrated in FIG. 5, but in alternate embodiments the source line dielectric 48 may be completely removed from over the source line 46 in the strap section 40 before the interlayer dielectric 54 is formed, as mentioned above.

Figure 6:
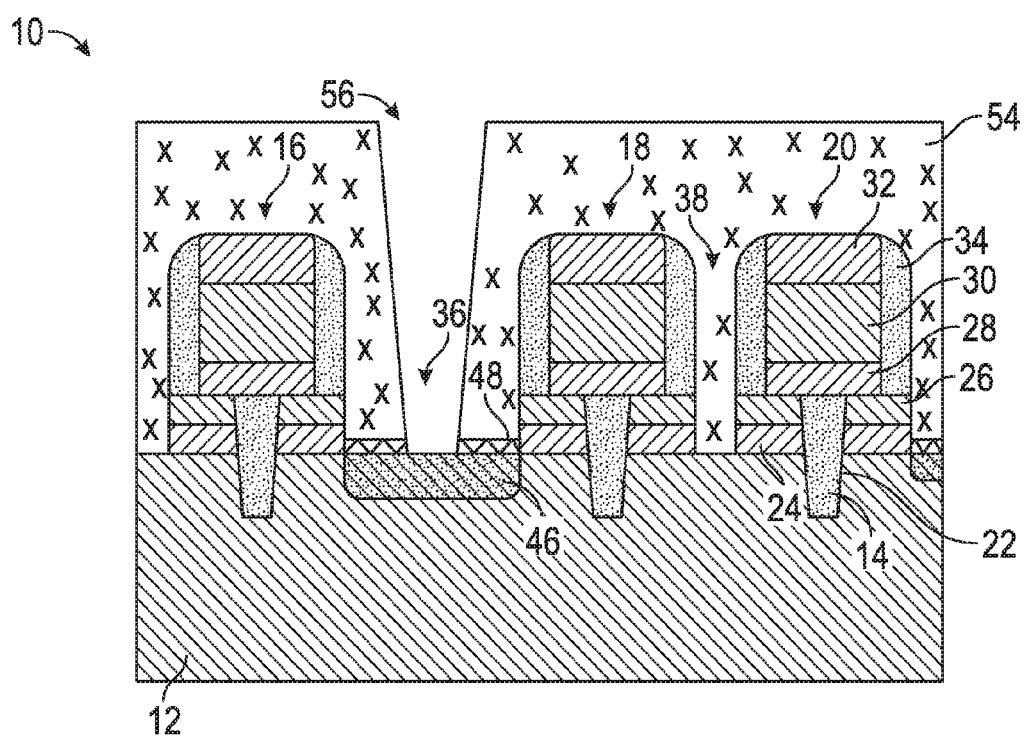

Referring to FIG. 6 with continuing reference to FIG. 5, a via 56 is formed through the interlayer dielectric 54 to the source line dielectric 48. The source line dielectric 48 may be removed from within the via 56 by a silicide pre-cleaning process, or by other processes. Therefore, at least a portion of the source line dielectric 48 that is within the strap section 40 is removed, because the via 56 may not expose the entire source line dielectric 48 within the strap section 40. The via 56 may be formed by lithographically isolating the location of the via 56, and then etching through the interlayer dielectric 54 to the source line dielectric 48 or to the surface of the source line 46 in embodiments where the source line dielectric 48 has been previously removed. A reactive ion etch with silicon tetrafluoride may be used to etch through the interlayer dielectric 54 to form the via 56, but many other etchants or etching techniques may be used in alternate embodiments. The silicide pre-cleaning process may include rinsing with an organic solution followed by a dilute hydrofluoric acid solution, and then rinsing with deionized water and dried. Other cleaning embodiments are also possible, such as dipping the integrated circuit 10 in dilute hydrofluoric acid and then drying. The integrated circuit 10 may then optionally be further cleaned with sputtered argon ions. The hydrofluoric acid in the silicide pre-cleaning process, or other aspects of the silicide pre-cleaning process, may remove any remaining portions of the source line dielectric 48 overlying the source line 46 within the via 56.

Figure 7:
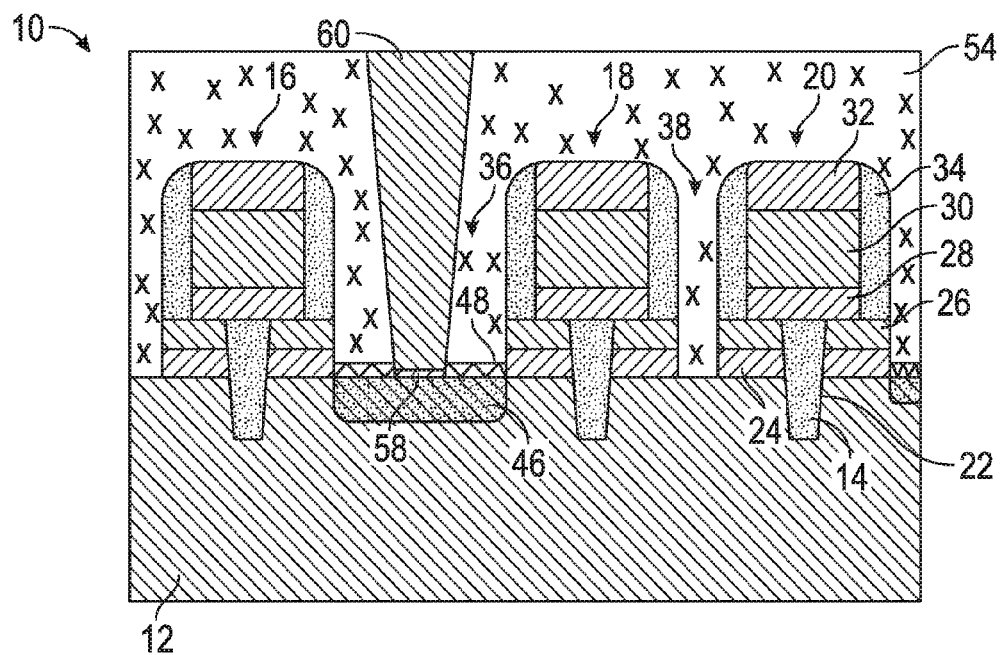

A silicide 58 is formed on the exposed surface of the source line 46 after the source line dielectric 48 is removed. A contact 60 is formed in the via 56 after the silicide 58 is formed, as illustrated in FIG. 7 with continuing reference to FIG. 6. The contact 60 is formed in electrical communication with the source line 46 in the strap section 40. The silicide may be formed by depositing a layer of metal (not individually illustrated) followed by an anneal process. The metal, such as nickel, titanium, cobalt, or other metals, may be deposited by sputtering or chemical vapor deposition, and the metal reacts with available silicon to form a silicide during the anneal. However, the metal does not react with the dielectrics or other materials. Therefore, removal of the source line dielectric 48 from overlying the source line 46 within the via 56 is important, because if the source line dielectric 48 separates the source line 46 from the deposited metal layer the silicide 58 will not form and the electrical connection between the contact 60 and the source line 46 may be compromised. Once the silicide 58 is formed, overburden from the layer of metal (not illustrated) may be removed, such as a wet etch with a mixture of nitric acid, acetic acid, and sulfuric acid for nickel. Other etchants may be used for nickel or for other metals used to form the silicide 58.

The contact 60 may include an adhesion layer, a barrier layer, and a plug (not individually illustrated), which may be sequentially deposited. In an exemplary embodiment, an adhesion layer of titanium is formed by low pressure chemical vapor deposition of titanium pentachloride, a barrier layer of titanium nitride is formed by chemical vapor deposition of titanium tetrabromide and ammonia, and a plug of tungsten is formed by chemical vapor deposition of tungsten hexafluoride and hydrogen. Other types of contacts are also possible, such as copper or other conductive materials.

Alternate embodiments for removing the source line dielectric 48 from overlying the source line area 36 within the strap section 40 prior to formation of the silicide 58 are also possible, even without the use a lithographic technique dedicated to such removal. One alternate embodiment is described below, where the reference numbers for the same components are differentiated by the prefix "1" to distinguish the embodiment described above from the embodiment described below. As an example, the substrate in FIGS. 1-7 is indicated by reference number 12, and the substrate in FIGS. 8-14 is indicated by reference number 112. The embodiment described above may be combined with the embodiment described below, or either embodiment may be used without the other, or various portions of the embodiments can be combined in a variety of manners, but the lithographic technique dedicated to removing the source line dielectric 48 from over the source line area 36 in the strap section 40 is not needed in any case.

Figure 8:
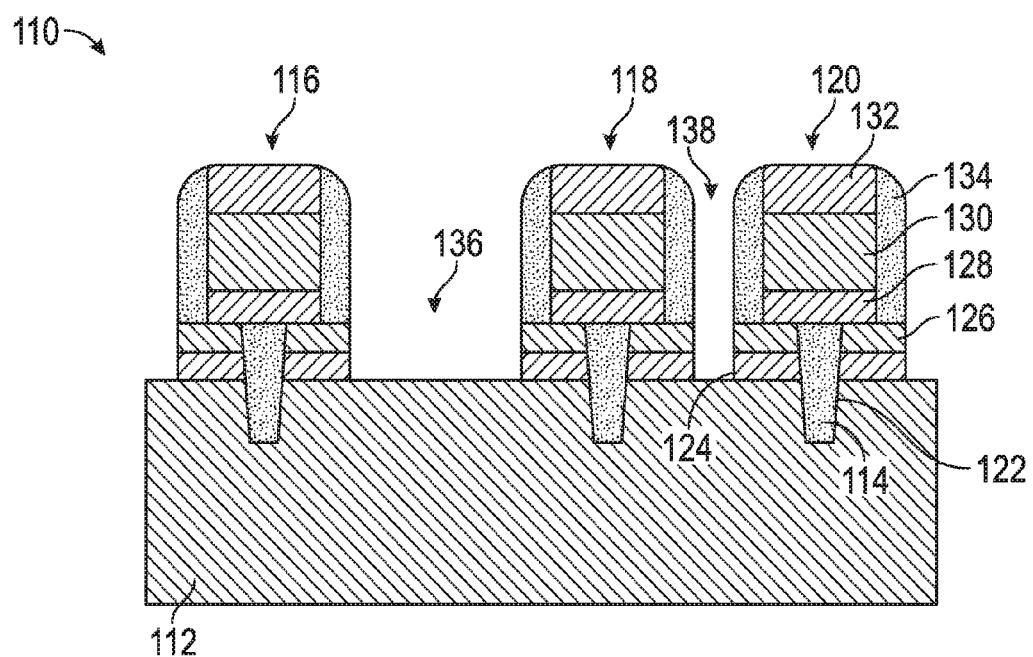
FIG. 8-14 illustrated an integrated circuit and alternate embodiments for its fabrication, where

Referring to FIG. 8, the second embodiment described herein begins at the same point in the manufacturing process as the first embodiment described above. Referring to an exemplary embodiment in FIG. 9, the source line photoresist mask 144 is formed and patterned to expose the substrate 112 in the source line area 136 within the active section 142 while covering the substrate 112 in the drain line area 138 in both the strap and active sections 140, 142. However, the source line photoresist mask 144 is patterned to cover the source line area 136 in the strap section 140. As such, conductivity determining ions are implanted into the substrate 112 to form the source line 146 within the source line area 136 within the active section 142 of the integrated circuit 110, but about zero conductivity determining impurities are implanted into the substrate 112 in the source line area 136 that is within the strap section 140 of the integrated circuit 110. As such, within the strap section 140 the substrate 112 has about the same concentration of conductivity determining impurities in the source line area 136 as in the drain line area 138, but in the active section 142 the substrate 112 has a higher concentration of conductivity determining impurities within the source line 146 (which is in the source line area 136) then within the drain line area 138.

Figure 9:
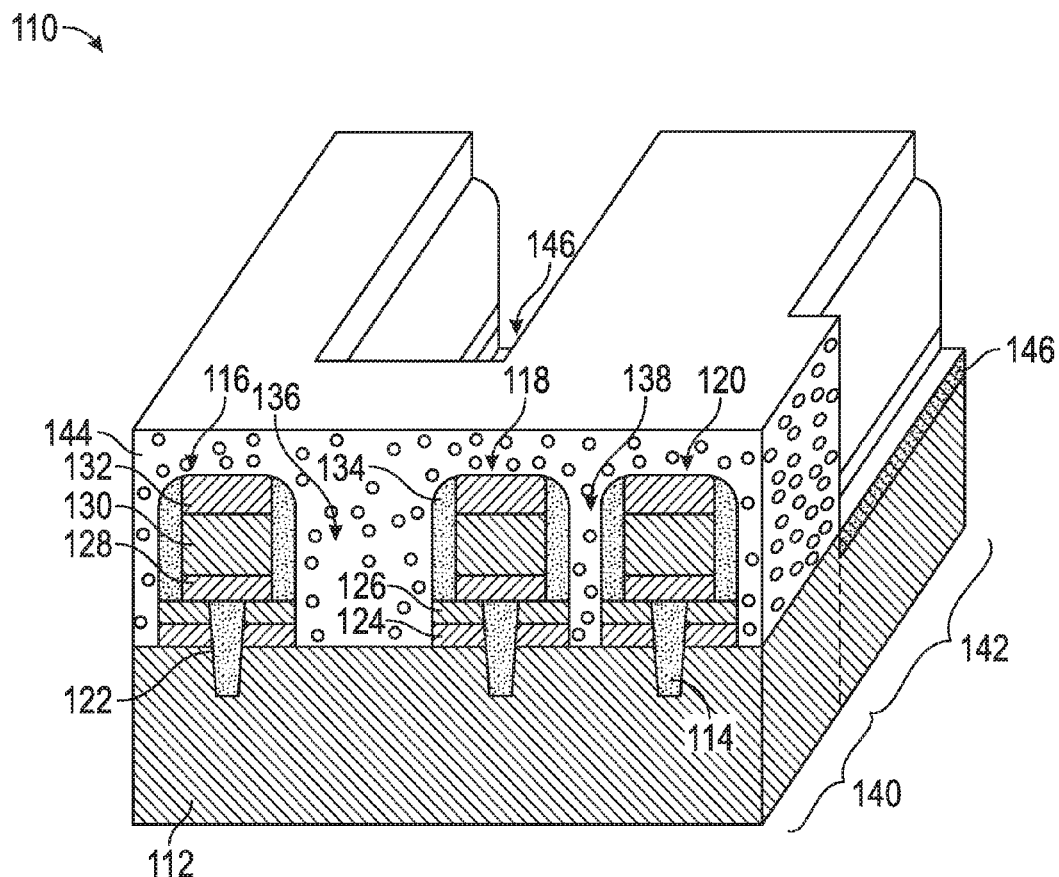
Figure 10:
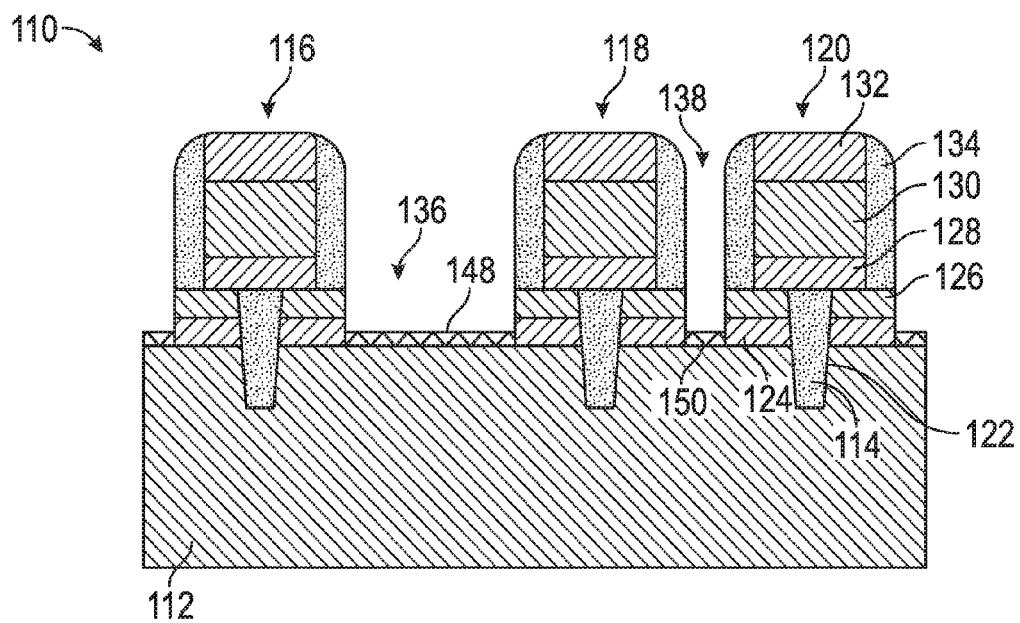

The source line dielectric 148 and the drain line dielectric 150 are formed after the source line photoresist mask 144 is removed, as illustrated in an exemplary embodiment in FIG. 10 with continuing reference to FIG. 9. The source line dielectric 148 and the drain line dielectric 150 may be formed simultaneously by thermal oxidation of the substrate 112, as described above. In this embodiment, the thickness of the source line dielectric 148 is about the same as the thickness of the drain line dielectric 150 in the strap section 140, such as within about 10 percent of the thickness of the drain line dielectric 150. The substrate 112 in the source line area 136 has about the same concentration of conductivity determining impurities as the substrate 112 in the drain line area 138 within the strap section 140 of the integrated circuit 110, so the thermal oxide grows at about the same rate in both locations. In an exemplary embodiment, the source line dielectric 148 within the strap section 140 has a thickness of from about 150 to about 250 angstroms after formation, but other thicknesses are also possible. In the embodiment illustrated in FIGS. 9 and 10, the source line dielectric 148 has a greater thickness in the active section 142 than in the strap section 140.

Figure 11:
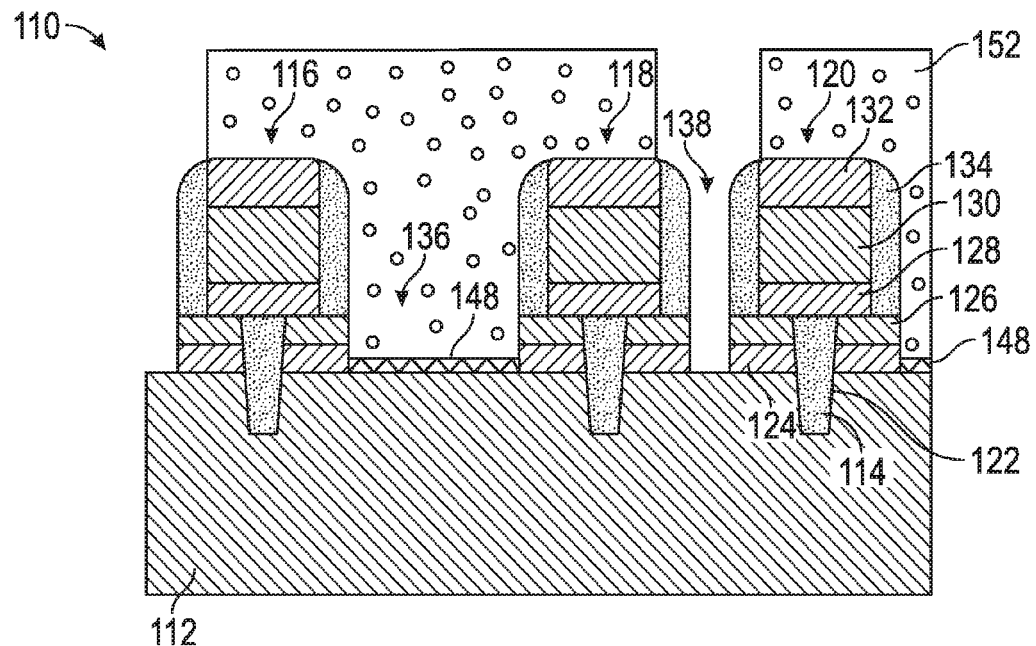

Referring to FIG. 11 with continuing reference to FIGS. 9 and 10, the drain line photoresist mask 152 is formed and patterned to expose the substrate 112 in the drain line area 138. The drain line photoresist mask 152 may be patterned to cover the source line dielectric 148 in the strap section 140, as illustrated in FIG. 11, so the source line dielectric 148 remains in place until later in the process. However, in alternate embodiments, the drain line photoresist mask 152 may be patterned to expose the source line dielectric 148 in the strap section 140, as previously illustrated in FIG. 4. The source line dielectric 148 is thinner in embodiments where the substrate 112 is not implanted with conductivity determining impurities in the strap section 140 prior to formation of the source and drain line dielectrics 148, 150, as opposed to embodiments where the source line 46 (illustrated in FIG. 2) is formed before the source line dielectric 148 is formed. Therefore, it may not be necessary to reduce the thickness of the source line dielectric 148 while removing the drain line dielectric 150 in the strap section 140 in such cases. However, the techniques described above may optionally be employed to remove or reduce the thickness of the source line dielectric 148 at the same time as the drain line dielectric 150 is removed. Also, as described above, no lithographic process dedicated to removing the source line dielectric 148 is required.

Figure 12:
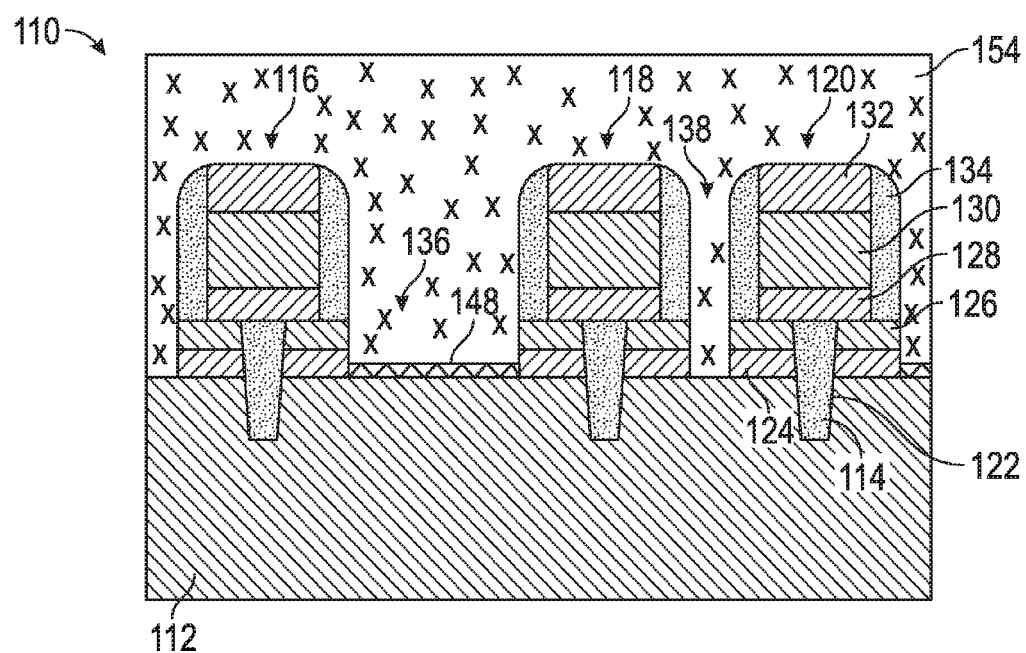
Figure 13:
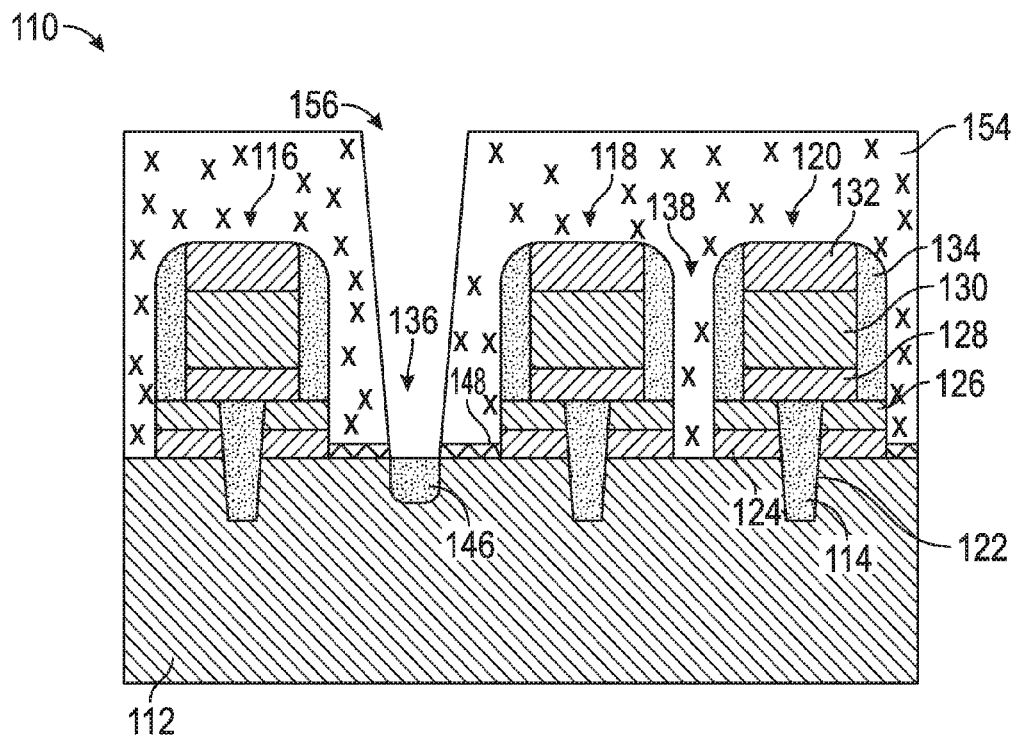

Referring to FIG. 12, the interlayer dielectric 154 is formed as described above. The via 156 may then be formed, as illustrated in an exemplary embodiment in FIG. 13, and conductivity determining impurities may be implanted into the substrate 112 between the first and second memory cells 116, 118. The increased concentration of conductivity determining impurities extends the source line 146 such that the source line 146 is present in the strap section 140. The source line 146 in the strap section 140 has a higher concentration of conductivity determining impurities than the substrate 112 prior to implantation of conductivity determining impurities, and as such the source line 146 in the strap section 140 has a higher electrical conductivity than the substrate 112 prior to implantation of conductivity determining impurities. Any portion of the source line dielectric 148 that may be present within the via 156 can be removed as described above.

Figure 14:
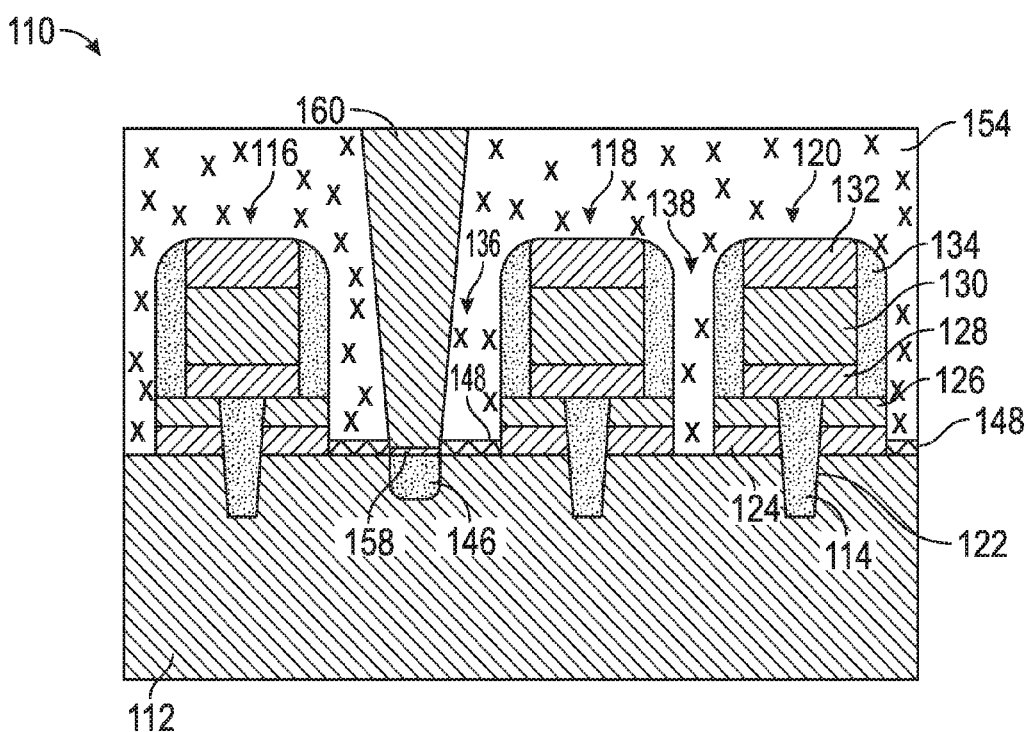

The silicide 158 and the contact 160 may then be formed, as illustrated in FIG. 14 with additional reference to FIG. 9, where the contact 160 that is within the strap section 140 is in electrical communication with the source line 146 that is within the strap section 140. Variations of the embodiments described herein are possible, including washing or etching techniques to reduce and/or eliminate the source line dielectric 148 from overlying the substrate 112 within the strap section 140.

While at least two exemplary embodiments have been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    patterning a source line photoresist mask to overlie a drain line area of a substrate while exposing a source line area of the substrate, wherein the source line area is defined between a first memory cell and a second memory cell, and wherein the drain line area is defined between the second memory cell and a third memory cell;
    forming a source line in the source line area;
    concurrently forming a source line dielectric and a drain line dielectric, wherein the source line dielectric overlies the source line and the drain line dielectric overlies the drain line area;
    patterning a drain line photoresist mask to overlie the source line in an active section of the integrated circuit, wherein the drain line photoresist mask exposes the source line in a strap section of the integrated circuit, and wherein the drain line photoresist mask exposes the drain line area; and
    removing the drain line dielectric from overlying the drain line area, wherein a thickness of the source line dielectric in the strap section is reduced while removing the drain line dielectric from overlying the drain line area.

2. The method of claim 1 wherein patterning the source line photoresist mask comprises patterning the source line photoresist mask wherein the first memory cell, the second memory cell, and the third memory cell each comprise a floating gate overlying the substrate, a control gate dielectric overlying the floating gate, and a control gate overlying the control gate dielectric.

3. The method of claim 2 wherein patterning the source line photoresist mask comprises patterning the source line photoresist mask wherein each of the first memory cell, the second memory cell, and the third memory cell directly overlie a shallow trench isolation structure.

4. The method of claim 3 wherein pattering the source line photoresist mask comprises patterning the source line photoresist mask wherein the first memory cell, the second memory cell, and the third memory cell comprise a floating gate dielectric overlying the substrate and directly underlying the floating gate, and wherein the floating gate dielectric is adjacent to the shallow trench isolation structure.

5. The method of claim 1 further comprising:
    removing at least a portion of the source line dielectric overlying the strap section after reducing the thickness of the source line dielectric in the strap section.

6. The method of claim 1 wherein:
    forming the source line dielectric overlying the source line while forming the drain line dielectric overlying the drain line area comprises forming the source line dielectric where the thickness of the source line dielectric is greater than a thickness of the drain line dielectric.

7. The method of claim 1 further comprising:
    forming an interlayer dielectric overlying the source line and the drain line area; and
    forming a contact in electrical communication with the source line in the strap section, wherein the contact is formed in the absence of a lithographic step dedicated to removing the source line dielectric from overlying the source line in the strap section.

8. The method of claim 7 further comprising:
    forming a via through the interlayer dielectric, wherein the via directly overlies the source line in the strap section.

9. The method of claim 8 further comprising:
    removing the source line dielectric from overlying the source line within the via.

10. The method of claim 8 further comprising:
    forming a silicide overlying the source line within the via prior to forming the contact.

11. A method of producing an integrated circuit comprising:
- patterning a source line photoresist mask to overlie a drain line area while exposing a source line area within an active section of the integrated circuit, wherein the source line photoresist mask overlies the source line area in a strap section of the integrated circuit, wherein the source line area is within a substrate between a first memory cell and a second memory cell, and wherein the drain line area is within the substrate between the second memory cell and a third memory cell;
- forming a source line in the source line area of the active section; and
- concurrently forming a source line dielectric and a drain line dielectric, wherein the source line dielectric overlies the source line area in both the active section and the strap section and the drain line dielectric overlies the drain line area in both the active section and the strap section;
- forming an interlayer dielectric overlying the source line area and the drain line area;
- forming a via through the interlayer dielectric to the source line area in the strap section;
- removing the source line dielectric from overlying the source line area within the via; and
- forming a contact in electrical communication with the source line area in the strap section.

12. The method of claim 11 further comprising:
forming the source line in the strap section by implanting conductivity determining impurities into the source line area exposed through the via prior to forming the contact.

13. The method of claim 11 wherein:
forming the source line dielectric overlying the source line area comprises forming the source line dielectric wherein a thickness of the source line dielectric is within about 10 percent of a thickness of the drain line dielectric.

14. The method of claim 11 wherein patterning the source line photoresist mask comprises:
patterning the source line photoresist mask wherein the first memory cell, the second memory cell and the third memory cell each comprise a floating gate overlying the substrate, a control gate dielectric overlying the floating gate, and a control gate overlying the control gate dielectric.

15. The method of claim 14 wherein patterning the source line photoresist mask comprises patterning the source line photoresist mask wherein the first memory cell, the second memory cell, and the third memory cell each directly overlie a shallow trench isolation structure.

16. The method of claim 15 wherein patterning the source line photoresist mask comprises patterning the source line photoresist mask wherein the first memory cell, the second memory cell, and the third memory cell each comprise a floating gate dielectric overlying the substrate and directly underlying the floating gate, and wherein the floating gate dielectric is adjacent to the shallow trench isolation structure.

17. The method of claim 15 wherein forming the contact in electrical communication with the source line area of the strap section comprises forming the contact in the absence of a lithographic step dedicated to removing the source line dielectric from overlying the source line area within the strap section.

18. A method of producing an integrated circuit comprising:
- patterning a source line photoresist mask to overlie a drain line area while exposing a source line area within an active section of the integrated circuit, wherein the source line photoresist mask overlies the source line area in a strap section of the integrated circuit, wherein the source line area is defined within a substrate between a first memory cell and a second memory cell, wherein the drain line area is defined within the substrate between the second memory cell and a third memory cell;
- forming a source line in the source line area within the active section of the integrated circuit;
- concurrently forming a source line dielectric and a drain line dielectric, wherein the source line dielectric overlies the source line area and the drain line dielectric overlies the drain line area;
- patterning a drain line photoresist mask to overlie the source line in the active section, wherein the drain line photoresist mask exposes the source line area in the strap section of the integrated circuit, and wherein the drain line photoresist mask exposes the drain line area in both the active section and the strap section of the integrated circuit;
- removing the drain line dielectric from overlying the drain line area, wherein a thickness of the source line dielectric in the strap section of the integrated circuit is reduced while removing the drain line dielectric from overlying the drain line area;
- forming an interlayer dielectric overlying the source line area and the drain line area; and
- forming a contact in electrical communication with the source line area in the strap section.

19. The method of claim 18 wherein patterning the source line photoresist mask comprises patterning the source line photoresist mask wherein the first memory cell, the second memory cell and the third memory cell each comprise a floating gate overlying the substrate, a control gate dielectric overlying the floating gate, and a control gate overlying the control gate dielectric.

20. The method of claim 19 wherein patterning the source line photoresist mask comprises patterning the source line photoresist mask wherein the first memory cell, the second memory cell, and the third memory cell each directly overlie a shallow trench isolation structure.

* * * * *

UNITED STATES PATENT AND TRADEMARK OFFICE
CERTIFICATE OF CORRECTION

PATENT NO. : 9,929,165 B1
APPLICATION NO. : 15/278112
DATED : March 27, 2018
INVENTOR(S) : Laiqiang Luo et al.

It is certified that error appears in the above-identified patent and that said Letters Patent is hereby corrected as shown below:

In the Specification

Column 1, Line 52, the word 'source' should be replaced with the word --drain--; and Column 1, Line 53, the word 'drain' should be replaced with the word --source--

Signed and Sealed this
Fourth Day of September, 2018

Andrei Iancu
*Director of the United States Patent and Trademark Office*